(12) United States Patent
Schimperna et al.

(10) Patent No.: US 11,380,810 B2
(45) Date of Patent: Jul. 5, 2022

(54) LUMINESCENT SOLAR CONCENTRATOR

(71) Applicant: ENI S.P.A., Rome (IT)

(72) Inventors: Giuiliana Schimperna, Novara (IT); Liliana Gila, Casalino (IT)

(73) Assignee: ENUI S.P.A., Rome (IT)

( * ) Notice: Subject to any disclaimer, the term of this patent is extended or adjusted under 35 U.S.C. 154(b) by 128 days.

(21) Appl. No.: 16/334,983

(22) PCT Filed: Sep. 22, 2017

(86) PCT No.: PCT/EP2017/073996
§ 371 (c)(1),
(2) Date: Mar. 20, 2019

(87) PCT Pub. No.: WO2018/055074
PCT Pub. Date: Mar. 29, 2018

(65) Prior Publication Data
US 2019/0288142 A1  Sep. 19, 2019

(30) Foreign Application Priority Data
Sep. 23, 2016  (IT) .................. 102016000095693

(51) Int. Cl.
*H01L 31/055* (2014.01)
*H01L 31/0468* (2014.01)
(Continued)

(52) U.S. Cl.
CPC .......... *H01L 31/055* (2013.01); *C09K 11/025* (2013.01); *C09K 11/06* (2013.01);
(Continued)

(58) Field of Classification Search
CPC ..... H01L 31/055; H01L 31/0468; H01G 9/20; C09K 11/025; C09K 11/06;
(Continued)

(56) References Cited

U.S. PATENT DOCUMENTS

| | | | |
|---|---|---|---|
| 2008/0149165 A1 | 6/2008 | Hoeks et al. | |
| 2012/0138124 A1* | 6/2012 | Shmueli | H01L 31/055 136/247 |
| 2016/0327714 A1* | 11/2016 | Patrick | H01L 31/055 |

FOREIGN PATENT DOCUMENTS

WO    WO-2014102742 A1 *  7/2014  ........... C09K 11/025

OTHER PUBLICATIONS

Ion, Rodica-Mariana, and Laurentiu Fara. "Photophysical and Photochemical Properties of Dye Molecules in Polymers Used for Fluorescent Solar Concentrators." Proceedings of the Indian Academy of Sciences, vol. 107, No. 6, Dec. 6, 1995, pp. 825-830. (Year: 1995).*

(Continued)

*Primary Examiner* — Bethany L Martin
*Assistant Examiner* — Kourtney R S Carlson
(74) *Attorney, Agent, or Firm* — Husch Blackwell LLP

(57) ABSTRACT

Luminescent solar concentrator (LSC) comprising at least one solution including at least one photoluminescent compound and at least one polyether polyol. Said luminescent solar concentrator (LSC) can be advantageously used in photovoltaic devices (or solar devices) such as, for example, photovoltaic cells (or solar cells), photoelectrolytic cells. In addition, said luminescent solar concentrator (LSC) can be advantageously used in photovoltaic windows.

11 Claims, 3 Drawing Sheets

1a

1b

(51) Int. Cl.
*C09K 11/02* (2006.01)
*C09K 11/06* (2006.01)
*H01G 9/20* (2006.01)

(52) U.S. Cl.
CPC .. H01L 31/0468 (2014.12); *C09K 2211/1007* (2013.01); *C09K 2211/1014* (2013.01); *C09K 2211/1018* (2013.01); *H01G 9/20* (2013.01); *Y02E 10/52* (2013.01)

(58) Field of Classification Search
CPC .... C09K 2211/1007; C09K 2211/1014; C09K 2211/1018
USPC ......................................................... 136/246
See application file for complete search history.

(56) References Cited

OTHER PUBLICATIONS

International Search Report and Written Opinion for PCT/EP2017/073996 dated Dec. 21, 2017, 10 pages.

* cited by examiner

LUMINESCENT SOLAR CONCENTRATOR

SUMMARY

The present invention relates to a luminescent solar concentrator.

More particularly, the present invention relates to a luminescent solar concentrator (LSC) comprising at least one solution including at least one photoluminescent compound and at least one polyether polyol.

Said luminescent solar concentrator (LSC) can be advantageously used in photovoltaic devices (or solar devices) such as, for example, photovoltaic cells (or solar cells), photoelectrolytic cells. In addition, said luminescent solar concentrator (LSC) can be advantageously used in photovoltaic windows.

Consequently, the present invention also relates to a photovoltaic device (or solar device) comprising at least one photovoltaic cell (or solar cell) and at least one luminescent solar concentrator (LSC), said luminescent solar concentrator (LSC) comprising at least one solution including at least one photoluminescent compound and at least one polyether polyol.

The present invention also relates to a photovoltaic window comprising at least one photovoltaic cell (or solar cell) and at least one luminescent solar concentrator (LSC), said luminescent solar concentrator (LSC) comprising at least one solution including at least one photoluminescent compound and at least one polyether polyol.

In the state of the art, one of the main limits to the exploitation of solar radiation energy is represented by the ability of photovoltaic devices (or solar devices) to optimally absorb only the radiations with wavelengths within a narrow spectral range.

For example, against a spectral range of solar radiation extending from about 300 nm to about 2500 nm wavelengths, photovoltaic cells (or solar cells) based on crystalline silicon, for example, have an optimum absorption area (effective spectrum) in the range of 900 nm to 1100 nm, whilst polymer photovoltaic cells (or solar cells) can be damaged if exposed to wavelength radiations of less than about 500 nm, due to induced photodegradation phenomena which become significant below this limit. Typically, the efficiency of photovoltaic devices (or solar devices) in the state of the art is maximum within the spectrum region ranging from 570 nm to 680 nm (yellow-orange).

The disadvantages mentioned above involve a limited external quantum efficiency (EQE) of the photovoltaic device (or solar device), defined as the ratio between the number of electron-hole pairs generated in the semiconductor material of the solar device and the number of photons incident on the solar device.

Devices have been developed to improve the external quantum efficiency (EQE) of photovoltaic devices (or solar devices), i.e. luminescent solar concentrators (LSCs) which, interposed between the light source (the sun) and the photovoltaic device (or solar device) selectively absorb the incident radiations having wavelengths outside the effective spectrum of the photovoltaic device (or solar device), emitting the absorbed energy in the form of photons having a wavelength within the effective spectrum. When the energy of the photons emitted by a luminescent solar concentrator (LSC) is higher than that of the incident photons, the photoluminescence process, comprising the absorption of solar radiation and the subsequent emission of photons having a lower wavelength, is also called "up-conversion" process. Conversely, when the energy of the photons emitted by a luminescent solar concentrator (LSC) is lower than that of the incident photons, the photoluminescence process is called "down-shifting" process.

Typically, the luminescent solar concentrators (LSCs) known in the state of the art are in the solid state and comprise a support made of a material transparent, as such, to the radiations of interest (for example, transparent glass or transparent polymer materials), comprising photoluminescent compounds consisting of organic compounds or metal complexes. In particular, the support is transparent to radiations having a frequency within the effective spectrum of the photovoltaic device (or solar device).

Said photoluminescent compounds can be deposited on the glass support in the form of thin films or, as in the case of the polymer materials, they can be dispersed within the polymer matrix. Alternatively, the polymer matrix can be directly functionalized with photoluminescent chromophore groups.

Ideally, in order to be used in luminescent solar concentrators (LSCs), the photoluminescent compounds must have the following characteristics:

high luminescence quantum efficiency ($\phi$)[($\phi$) is defined according to equation (1) below reported as the ratio between the number of photons emitted and the number of photons absorbed by a luminescent molecule per time unit and has a maximum value equal to 1:

$$(\phi)=\text{number of photons emitted/number of photons absorbed} \qquad (1);$$

wide absorption band;

high molar extinction coefficient ($\varepsilon$);

emission band in the spectral region wherein the photovoltaic device (or solar device) is most efficient;

absorption and emission bands well separated obtainable, for example, thanks to a high Stokes shift defined as the difference, normally measured in frequency units ($cm^{-1}$), between the spectral positions of the maximum values of the absorption band and of the emission band, in order to avoid or minimise self-absorption phenomena.

Luminescent solar concentrators (LSCs) in the liquid state are also known. Typically, said luminescent solar concentrators (LSCs) in the liquid state consist of a container with walls transparent, as such, to the radiations of interest (for example, transparent glass or transparent polymer materials), which is filled with a solution generally comprising an organic solvent such as, for example, toluene, methanol, ethanol, chloroform, dichlorobenzene and photoluminescent compounds consisting of organic compounds or metal complexes.

In particular, said walls are transparent to the radiations having a frequency within the effective spectrum of the photovoltaic device (or solar device).

Luminescent solar concentrators (LSCs) in the liquid state have been described, for example, in the article of Sholin Y. et al., published in "*Journal of Applied Physics*" (2007), Vol. 101, pg. 123114-1-123114-9. In particular, in said article, are compared the performance of luminescent solar concentrators (LSCs), comprising semiconductor polymers (e.g., MDMO-PPV, MEH-DOOPPV, red polyfluorene), or "quantum dot" (e.g., CdSe/ZnS, CdHgTe), with those luminescent solar concentrators (LSCs) comprising a photoluminescent dye, i.e. Rhodamine B, selected as a reference. For this purpose, the above mentioned semiconductor polymers are dissolved in chlorobenzene, the above mentioned "quantum dots" are dispersed in toluene, while said Rhodamine B is dissolved in a mixture consisting of propylene carbonate and ethylene glycol. The optical efficiency of said solutions is measured using "liquid devices" constructed by "bending" a glass rod to form a rectangular frame and gluing it between two microscope slides obtaining a "glass box" having dimensions of 2.5 cm×7.5 cm×0.5 cm and introducing the solution of the compound to be analysed in said "glass box" through a small opening which is then sealed. The data obtained show that semiconductor polymers (e.g., MDMO-PPV, MEH-DOOPPV, red polyfluorene) exhibit reduced overlaps between emission and absorption bands and, consequently, reduced self-absorption; moreover, their absorption can be controlled and their lifetimes in excited states are longer. Instead, as regards the "quantum dots", it is argued that the commercially available ones cannot be usefully employed as photoluminescent compounds for luminescent solar concentrators (LSCs) as they have a high self-absorption and their quantum yield is low. In said article it is therefore argued that the above mentioned semiconductor polymers can be used advantageously in luminescent solar concentrators (LSCs).

Luminescent solar concentrators (LSCs) in the liquid state are also described in the article of Kennedy M. et al., published in "*Proceedings of the 23$^{rd}$ European Photovoltaic Solar Energy Conference and Exhibition*", pg. 390-393, 1-5 Sep. 2008, Valencia, Spain. In said article, luminescent solar concentrators (LSCs) are studied, comprising various dyes at suitable concentrations, in order to increase the absorption of the solar spectrum with respect to luminescent solar concentrators (LSCs) comprising a single dye. However, the use of various dyes can lead to disadvantages such as, for example, loss of efficiency due to self-absorption effects. Consequently, in order to optimise the type and the quantity of dyes to be used in the construction of luminescent solar concentrators (LSCs) comprising various dyes, a suitable modified Montecarlo model was used. The predictions of this model were then tested experimentally using luminescent solar concentrators (LSCs) in the liquid state as these, unlike the ones in the solid state, generally consisting of a transparent polymer "doped" with photoluminescent dyes, allow simpler and more accurate measurements to be made. To said purpose, solutions in chloroform of dyes based on perylene and of dyes of BASF (e.g., Lumogen® Yellow 170, Lumogen® Orange 240, Lumogen® F Red 305) were examined, at different concentrations. The solutions thus prepared were introduced into a luminescent solar concentrator (LSC) consisting of a quartz cuvette having dimensions of 10 cm×4 cm×0.5 cm and of a silicon photovoltaic cell having dimensions of 2 cm×0.3 cm placed on one side of the cuvette.

From what is reported above, it can be deduced that the luminescent solar concentrators (LSCs) in liquid state known by the literature, have small dimensions with a relatively reduced volume of solvent, suitable for laboratory measurements. The preparation of luminescent solar concentrators (LSCs) in the liquid state on a large scale suitable, for example, for photovoltaic devices (or solar devices) or for photovoltaic windows, would therefore require the use of large volumes of toxic and/or inflammable and/or corrosive solvents such as, for example, toluene, dichlorobenzene, chloroform, methanol, with consequent harmful effects on both the environment and the health of the operators.

The Applicant therefore has faced the problem of finding luminescent solar concentrators (LSCs) in the liquid state, capable of overcoming the above mentioned disadvantages. In particular, the Applicant has faced the problem of replacing the above mentioned toxic and/or inflammable and/or corrosive solvents with non-hazardous solvents, which therefore have no adverse effects on both the environment and the health of the operators, i.e. with non-toxic, non-inflammable and non-corrosive solvents. It should be noted that for the purpose of the present invention, the term "non-hazardous solvents" means substances or mixtures of substances not classified as dangerous according to Regulation (EC) No. 1272/2008.

The Applicant has now found that it is possible to obtain luminescent solar concentrators (LSCs) in the liquid state, using solutions including at least one photoluminescent compound and at least one polyether polyol. The use of said solutions allows to avoid the use of toxic and/or inflammable and/or corrosive solvents and as a consequence, harmful effects on both the environment and the health of the operators, as well as to have lower disposal costs. Moreover, said solutions can easily be replaced at end-of-life without having to replace the entire photovoltaic device (or solar device) or the photovoltaic window with consequent lower maintenance costs. The luminescent solar concentrators (LSCs) thus obtained are able to maintain or even to improve the performance of photovoltaic devices (or solar devices) such as, for example, photovoltaic cells (or solar cells) and photoelectrolytic cells. In addition, said luminescent solar concentrators (LSCs) can advantageously be used in photovoltaic windows.

It is therefore the object of the present invention a luminescent solar concentrator (LSC) comprising a solution including at least one photoluminescent compound and at least one polyether polyol.

For the purpose of the present description and of the following claims, the definitions of the numeric intervals always include extremes unless there is different specification.

For the purposes of the present description and of the following claims, the term "comprising" also includes the terms "which consist essentially of" or "which consist of".

In accordance with a preferred embodiment of the present invention, this photoluminescent compound can be present in said solution in a molar concentration ranging from $1 \times 10^{-4}$ M to $3 \times 10^{-3}$ M, preferably ranging from $0.5 \times 10^{-3}$ M to $2 \times 10^{-3}$ M.

The photoluminescent compounds useful for the purpose of the present invention can be selected from photoluminescent compounds which absorb in the visible and which are soluble and stable in the above mentioned polyether polyol. Photoluminescent compounds which can be advantageously used for the purpose of the present invention are, for example, the perylene compounds known by the commercial name of Lumogen® of BASF, the acene compounds described, for example, in International Patent Application WO 2011/048458, in the name of the Applicant herein incorporated as reference, the benzothiadiazole compounds, the disubstituted benzoheterodiazole compounds described, for example, in the Italian Patent Application MI2014A001662 in the name of the Applicant here incorporated as reference, the disubstituted diaryloxybenzoheterodiazole compounds described, for example, in Italian Patent Application MI2014001663 in the name of the Applicant herein incorporated as reference.

In accordance with a preferred embodiment of the present invention, said photoluminescent compound can be selected, for example, from perylene compounds, benzothiadiazole compounds, disubstituted benzoheterodiazole compounds, disubstituted diaryloxybenzoheterodiazole compounds, or mixtures thereof.

Preferably, said photoluminescent compound can be selected, for example, from Lumogen® F Red 305 of BASF, 4,7-di-2-thienyl-2,1,3-benzothiadiazole (DTB), 5,6-diphenoxy-4,7-bis[5-(2,6-dimethylphenyl)-2-thienyl]benzo[c]1,2,5-thiadiazole (MPDTBOP),5,6-diphenoxy-4,7-bis[5-(2,5-dimethylphenyl)-2-thienyl]benzo[c]1,2,5-thiadiazole (PPDTBOP), or mixtures thereof.

In accordance with a preferred embodiment of the present invention, said polyether polyol can be selected, for example, from polyethylene glycols having a number average molecular weight ($M_n$) ranging from 150 daltons to 600 daltons, preferably ranging from 190 daltons to 400 daltons, or their mixtures; polypropylene glycols having a number average molecular weight ($M_n$) ranging from 250 daltons to 4000 daltons, preferably ranging from 400 daltons to 2800 daltons, or mixtures thereof; or mixtures thereof.

It should be noted that, with respect to the common organic solvents used (e.g., toluene), said polyethylene glycols and said polypropylene glycols, in addition to not being hazardous solvents, have the following physical characteristics: low vapour pressure ($\leq 0.01$ mm/Hg at 20° C.) and, therefore, a very low volatility; low freezing temperatures ($\leq -65°$ C.) and high boiling temperatures ($\geq 250°$ C.). Said physical characteristics allow the use of the luminescent solar concentrators (LSCs) which contain them also in critical temperature conditions.

Specific examples of polyethylene glycols and of polypropylene glycols which can be advantageously used for the purpose of the present invention and which are currently commercially available are: polyethylene glycol having a number average molecular weight ($M_n$) of 200 (PEG 200), polyethylene glycol having a number average molecular weight ($M_n$) of 400 (PEG 400), polypropylene glycol having a number average molecular weight ($M_n$) of 425 (PPG 425), polypropylene glycol having a number average molecular weight ($M_n$) of 2700 (PPG 2700), of Sigma-Aldrich. In this respect, it should be noted that the average molecular weight indicated by Sigma-Aldrich for PEG 200, for the purpose of the present invention, is to be understood as the number average molecular weight ($M_n$). In order to achieve greater light and/or ultraviolet rays stabilisation, the above mentioned solution can include additives known in art such as, for example: light stabilisers which can be selected, for example, from sterically hindered amines; UV absorbers which can be selected, for example from triazine, benzoxazinones, benzotriazoles, benzophenones, benzoates, formamidines, cinnamates or propenoates, aromatic propanediones, benzoimidazoles, cycloaliphatic ketones, formanilides including oxamides, cyanoacrylates, benzopyranones, salicylates, or mixtures thereof. When present, said additives can be present in the solution in an amount ranging from 0.005% by weight to 3% by weight, preferably from 0.05% by weight to 1% by weight, with respect to the weight of the polyether polyol.

The above mentioned solution can be prepared according to processes known in the art, for example by dissolving at least one photoluminescent compound in a polyether polyol by operating at a temperature ranging from 15° C. to 70° C., preferably ranging from 20° C. to 60° C., for a time ranging from 5 minutes to 80 minutes, preferably ranging from 10 minutes to 70 minutes.

In accordance with a preferred embodiment of the present invention, said luminescent solar concentrator (LSC) comprises:
 a cell for liquids in transparent material, said cell having four sides and being provided with at least one hole, preferably two holes, on at least one of the four sides, preferably on the same side;
 at least one solution including at least one photoluminescent compound and at least one polyether polyol contained within said cell for liquids.

The transparent material useful for the purpose of the present invention must be selected from transparent materials which must not be soluble in the solution contained in said cell for liquids, which must not have to interact with said solution, and which must be stable at the temperature of use of the luminescent solar concentrator (LSC) and, more generally, at the environmental conditions in which the same is used.

In accordance with a preferred embodiment of the present invention, said transparent material can be selected, for example, from: transparent glass such as, for example, silica, quartz, alumina, titania, or mixtures thereof. Silica, quartz are preferred. Said solution is defined above.

Said luminescent solar concentrators (LSCs) can be prepared by processes known in the art as described, for example, in the article of Kennedy M. et al. above reported, published in "*Proceedings of the 23rd European Photovoltaic Solar Energy Conference and Exhibition*", pg. 390-393, 1-5 Sep. 2008, Valencia.

A further object of the present invention is a photovoltaic device (or solar device) comprising at least one luminescent solar concentrator (LSC), said luminescent solar concentrator (LSC) comprising at least one solution including at least one photoluminescent compound and at least one polyether polyol.

In accordance with a further aspect, the present invention relates to a photovoltaic device (or solar device) comprising at least one photovoltaic cell (or solar cell) or at least one photoelectrolytic cell placed on the edges of at least one luminescent solar concentrator (LSC), said luminescent solar concentrator (LSC) comprising:
 a cell for liquids in transparent material, said cell having four sides and being provided with at least one hole, preferably two holes, on at least one of the four sides, preferably on the same side;
 at least one solution including at least one photoluminescent compound and at least one polyether polyol contained within said cell for liquids.

Said transparent material and said solution are defined above.

A further object of the present invention is a photovoltaic window comprising at least one luminescent solar concentrator (LSC), said luminescent solar concentrator (LSC) comprising at least one solution including at least one photoluminescent compound and at least one polyether polyol.

In accordance with a further aspect, the present invention relates to a photovoltaic window comprising at least one photovoltaic cell (or solar cell) or at least one photoelectrolytic cell placed on the edges of at least one luminescent solar concentrator (LSC), said luminescent solar concentrator (LSC) comprising:
 a cell for liquids in transparent material, said cell having four sides and being provided with at least one hole, preferably two holes, on at least one of the four sides, preferably on the same side;
 at least one solution including at least one photoluminescent compound and at least one polyether polyol contained within said cell for liquids.

Said transparent material and said solution are defined above.

The present invention will now be illustrated in more detail by way of an embodiment with reference to FIG. 1 below reported.

Figure 1:
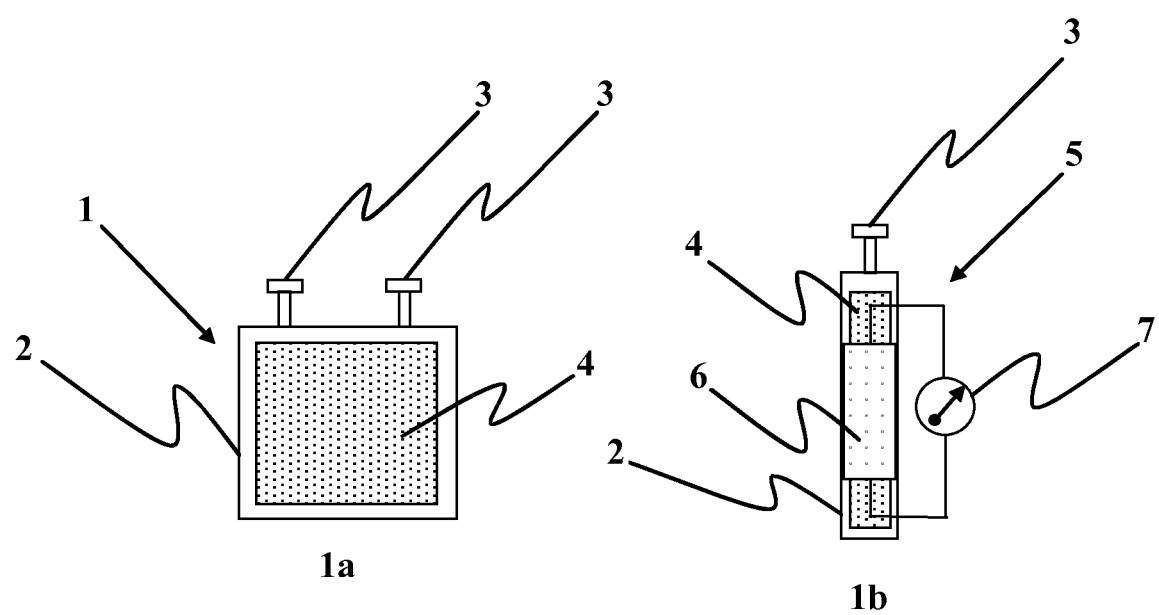
FIG. 1 represent a front view (1a) of a luminescent solar concentrator (LSC) (1) object of the present invention and a side view (1b) of a photovoltaic device (or solar device) (2) object of the present invention.

With reference to the front view (1a) shown in FIG. 1, the luminescent solar concentrator (LSC) (1) comprises a cell for liquids (2) in transparent material (e.g., quartz), two holes on the upper side (not shown in FIG. 1) closed with two plugs (3), a solution including at least one photoluminescent compound and at least one polyether polyol [e.g., 4,7-di-2-thienyl-2,1,3-benzothiadiazole (DTB), or 5,6-diphenoxy-4,7-bis[5-(2,6-dimethylphenyl)-2-thienyl]benzol [c]1,2,5-thiadiazole (MPDTBOP) dissolved in polyethylene glycol (PEG) or polypropylene glycol (PPG) having different number average molecular weight ($M_n$)] (4), contained within this cell for liquids (2).

With reference to the side view (1b) shown in FIG. 1, the photovoltaic device (or solar device) (5) comprises a luminescent solar concentrator (LSC) comprising a cell for liquids (2) in transparent material (e.g., quartz), two holes on the upper side (not shown in FIG. 1) closed with two plugs (3) [one plug is visible in the side view (1b)], a solution including at least one photoluminescent compound e.g., 4,7-di-2-thienyl-2,1,3-benzothiadiazole (DTB), or 5,6-diphenoxy-4,7-bis[5-(2,6-dimethylphenyl)-2-thienyl]benzole [c]1,2,5-thiadiazole (MPDTBOP) dissolved in polyethylene glycol (PEG) or polypropylene glycol (PPG) having different number average molecular weight ($M_n$)] (4), contained within this cell for liquids, a silicon photovoltaic cell (or solar cell) (6) [e.g., a photovoltaic cell (or solar cell)] placed on one of the sides of said cell for liquids (2), an ammeter (7) connected to said photovoltaic cell (or solar cell) (6).

In order to better understand and implement the present invention, below are some illustrative and non-limiting examples of the same.

In the following examples:
- the 4,7-di-2-thienyl-2,1,3-benzothiadiazole (DTB) has been synthesised as described in Example 1 of International Patent Application WO 2012/007834 in the name of the Applicant herein incorporated as a reference;
- the 5,6-diphenoxy-4,7-bis[5-(2,6-dimethylphenyl)-2-thienyl]benzo[c]1,2,5-thiadiazole (MPDTBOP) has been synthesised as described in Example 7 of the Italian Patent Application MI2014A001663 in the name of the Applicant herein incorporated as a reference.

EXAMPLE 1 (COMPARATIVE)

Preparation of Solutions of a Photoluminescent Compound in Toluene
DTB/Toluene Solution (Ref. 1)

22 mg of 4,7-di-2-thienyl-2,1,3-benzothiadiazole (DTB) and 72.9 ml of toluene (Aldrich) were placed in a 100 ml flask: the whole was left, under stirring, at room temperature (25° C.), for about 15 minutes, obtaining a yellow solution having a concentration of 4,7-di-2-thienyl-2,1,3-benzothiadiazole (BTD) in the solution equal to $1\times10^{-3}$ M.

(MPDTBOP)/Toluene Solution (Ref. 2)

10.4 mg of 5,6-diphenoxy-4,7-bis[5-(2,6-dimethylphenyl)-2-thienyl]benzo[c]1,2,5-thiadiazole (MPDTBOP) and 15.1 ml of toluene (Aldrich) were placed in a 50 ml flask: the whole was left, under stirring, at room temperature (25° C.), for about 15 minutes, obtaining a yellow solution having a concentration of (MPDTBOP) in the solution equal to $1\times10^{-3}$ M.

Lumogen® F Red 305/Toluene Solution (Ref. 3)

6.6 ml of a Lumogen® F Red 305/toluene solution at $2\times10^{-3}$ M concentration (previously prepared by dissolving 50.3 mg of Lumogen® F Red 305 in 23.2 ml of toluene, under stirring, at room temperature (25° C.), for about 15 minutes) and 6.6 ml of toluene (Aldrich) were placed in a 50 ml flask, obtaining a red solution having a concentration of Lumogen® F Red 305 in the solution equal to $1\times10^{-3}$ M.

EXAMPLE 2 (INVENTION)

Preparation of Solutions of a Photoluminescent Compound in Polyethylene Glycols
DTB/PEG 200 Solution (PEG8)

8.9 mg of 4,7-di-2-thienyl-2,1,3-benzothiadiazole (DTB) and 30.3 ml of polyethylene glycol ($M_n$=200) (PEG 200) (Sigma-Aldrich) were placed in a 50 ml flask: the whole was left, under stirring, at room temperature (25° C.), for about 20 minutes, obtaining an orange solution having a concentration of 4,7-di-2-thienyl-2,1,3-benzothiadiazole (BTD) in the solution equal to $1\times10^{-3}$ M.

DTB/PEG 400 Solution (PEG9)

9.5 mg of 4,7-di-2-thienyl-2,1,3-benzothiadiazole (DTB) and 31.6 ml of polyethylene glycol ($M_n$=400) (PEG 400) (Sigma-Aldrich) were placed in a 50 ml flask: the whole was left, under stirring, at room temperature (25° C.), for about 30 minutes, obtaining an orange solution having a concentration of 4,7-di-2-thienyl-2,1,3-benzothiadiazole (BTD) in the solution equal to $1\times10^{-3}$ M.

(MPDTBOP)/PEG400 Solution (PEG10)

18.5 mg of 5,6-diphenoxy-4,7-bis[5-(2,6-dimethylphenyl)-2-thienyl]benzo[c]1,2,5-thiadiazole (MPDTBOP) and 26.9 ml polyethylene glycol ($M_n$=400) (PEG 400) (Sigma-Aldrich) were placed in a 50 ml flask: the whole was left, under stirring, at 40° C., for about 60 minutes, obtaining a yellow-orange solution having a concentration of (MPDTBOP) in the solution equal to $1\times10^{-3}$ M.

Lumogen® F Red 305/PEG400 Solution (PEG11)

29.5 mg of Lumogen® F Red 305 (BASF) and 27.4 ml of polyethylene glycol ($M_n$=400) (PEG 400) (Sigma-Aldrich) were placed in a 50 ml flask: the whole was left, under stirring, at 40° C., for about 60 minutes, obtaining a red solution having a Lumogen® F Red 305 concentration in the solution equal to $1\times10^{-3}$ M.

EXAMPLE 3 (INVENTION)

Preparation of Solutions of a Photoluminescent Compound in Polypropylene Glycols
DTB/PPG425 Solution (PPG3)

11.1 mg of 4,7-di-2-thienyl-2,1,3-benzothiadiazole (DTB) and 26.9 ml of polypropylene glycol ($M_n$=425) (PPG 425) (Sigma-Aldrich) were placed in a flask of 50 ml: the whole was left, under stirring, at room temperature (25° C.), for about 40 minutes, obtaining a yellow solution having a concentration of 4,7-di-2-thienyl-2,1,3-benzothiadiazole (BTD) in the solution equal to $1\times10^{-3}$ M.

(MPDTBOP)/PPG425 Solution (PPG1)

18.4 mg of 5,6-diphenoxy-4,7-bis[5-(2,6-dimethylphenyl)-2-thienyl]benzo [c]1,2,5-thiadiazole (MPDTBOP) and 26.8 ml of polypropylene glycol ($M_n$=425) (PPG 425) (Sigma-Aldrich) were placed in a 50 ml flask: the whole was left, under stirring, at 40° C., for about 60 minutes, obtaining a yellow solution having a concentration of (MPDTBOP) in the solution equal to $1 \times 10^{-3}$ M.

Lumogen® F Red 305/PPG425 Solution (PPG2)

27 mg of Lumogen® F Red 305 (BASF) and 25 ml of polypropylene glycol ($M_n$=425) (Sigma-Aldrich) were placed in a 50 ml flask: the whole was left, under stirring, at 40° C., for about 60 minutes, obtaining a red solution having a concentration of Lumogen® F Red 305 in the solution equal to $1 \times 10^{-3}$ M.

(MPDTBOP)/PPG2700 Solution (PPG4)

19.8 mg of 5,6-diphenoxy-4,7-bis[5-(2,6-dimethylphenyl)-2-thienyl]benzo[c]1,2,5-thiadiazole (MPDTBOP) and 28.6 ml of polypropylene glycol ($M_n$=2700) (PPG 2700) (Sigma-Aldrich) were placed in a 50 ml flask: the whole was left, under stirring, at 40° C., for about 60 minutes, obtaining a yellow solution having a concentration of (MPDTBOP) in the solution equal to $1 \times 10^{-3}$ M.

Lumogen® F Red 305/PPG2700 Solution (PPG5)

27 mg of Lumogen® F Red 305 (BASF) and 25.4 ml of polypropylene glycol ($M_n$=2700) (Sigma-Aldrich) were placed in a 50 ml flask: the whole was left, under stirring, at 40° C., for about 60 minutes, obtaining a yellow solution having a concentration of Lumogen® F Red 305 in the solution equal to $1 \times 10^{-3}$ M.

EXAMPLE 4

Power Measurements ($P_{max}$)

The power measurements of some of the solutions obtained as described above in Example 1 (comparative), in Example 2 (invention) and in Example 3 (invention), were carried out by using a Hellma quartz cuvette having dimensions of 10 cm×10 cm×0.6 cm (optical path: 1 mm) filled with 8.1 ml of the solution to be analysed. A IXYS-XOD17 photovoltaic cell having an area of 1.2 cm$^2$ connected to an ammeter was applied to one cuvette edge.

The surface of the cuvette was then illuminated with a light source using an ABET solar simulator mod. SUN 2000 with a 550 Watt OF Xenon lamp having a power equal to 1 sun (1000 W/m$^2$) for 10 seconds. A first measurement was made illuminating the whole cuvette (10 cm×10 cm) and the electric power generated by the effect of the illumination was measured.

Subsequently, power measurements were carried out covering surfaces of the cuvette having a variable area with a opaque coating (mask), at a distance increasing from the edge on which the photovoltaic cell was fixed (total 10 measurements). Subsequently, a last measurement was made on an illuminated surface area of 1 cm×10 cm located on the opposite side to the edge on which the photovoltaic cell was fixed. These measurements, under variable shielding conditions, allow the contribution of optional waveguide, edge or multiple diffusion effects due to the support to be quantified and then removed.

Figure 2:
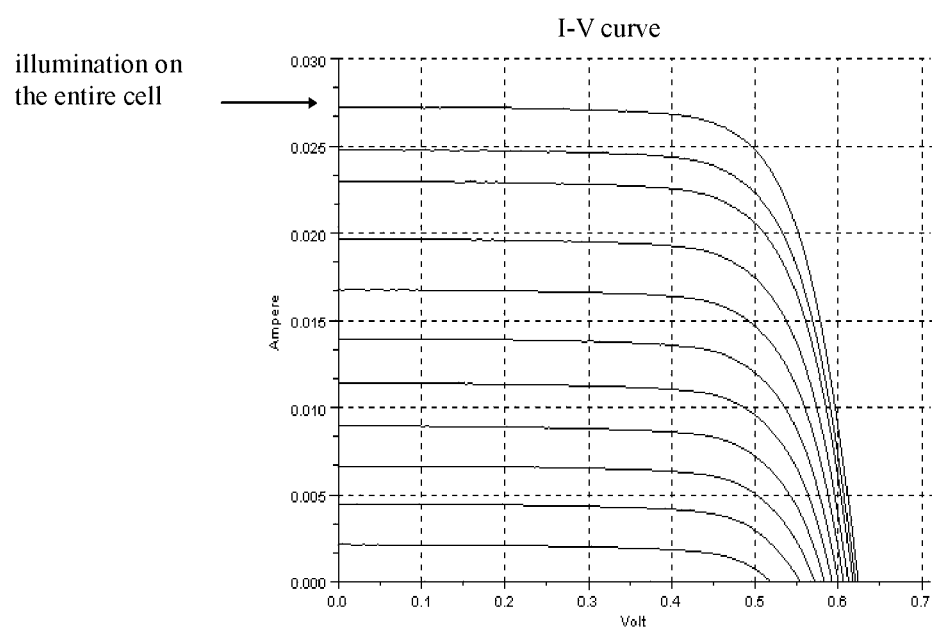
FIG. 2 represents a light intensity—current produced curve from an illuminated cuvette.
Figure 3:
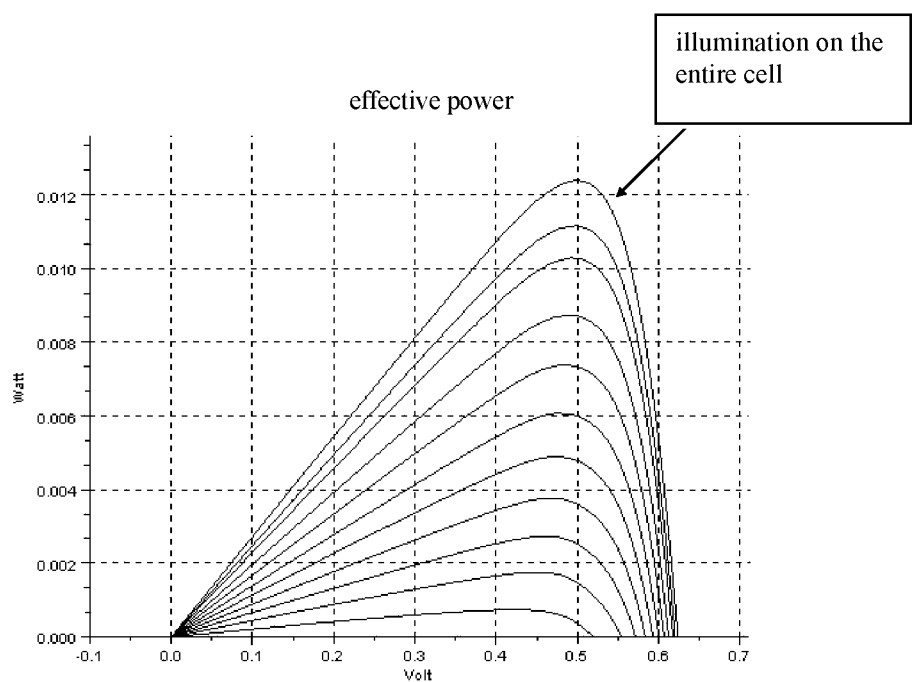
FIG. 3 represents the effective power of the photovoltaic cells from the current produced from the illuminated cuvette.

For each portion of the illuminated cuvette, the light intensity curve (measured in amperes)– current produced (measured in volt) (IN curves shown in FIG. 2) was recorded and from this the effective power of the photovoltaic cell (curves shown in FIG. 3) was calculated: the maximum effective power ($P_{max}$) was subsequently normalised per cm$^2$ of illuminated surface.

Table 1 shows the average effective maximum power values ($P_{max\ average}$) which is obtained from the average of all effective power values ($P_{max}$) normalized per cm$^2$ of illuminated surface, calculated for each portion of illuminated cuvette, omitting the first and last measurement relative to the portion of the cuvette containing the edge with the photovoltaic cell and the opposite edge, respectively.

TABLE 1

| SAMPLE | PHOTOLUMINESCENT COMPOUND | SOLVENT | $P_{max\ average}$ (mW/cm$^2$) |
|---|---|---|---|
| Ref. 1 | DTB | toluene | 0.038 |
| Ref. 2 | MPDTBOP | toluene | 0.054 |
| Ref. 3 | F305 | toluene | 0.067 |
| PEG8 | DTB | PEG200 | 0.034 |
| PEG9 | DTB | PEG400 | 0.036 |
| PEG10 | MPDTBOP | PEG400 | 0.050 |
| PEG11 | F305 | PEG400 | 0.035 |
| PPG1 | MPDTBOP | PPG425 | 0.048 |
| PPG2 | F305 | PPG425 | 0.062 |
| PPG3 | DTB | PPG425 | 0.037 |

From the data shown in Table 1 it is deduced that:

in the case of 4,7-di-2-thienyl-2,1,3-benzothiadiazole (DTB) and of 5,6-diphenoxy-4,7-bis[5-(2,6-dimethylphenyl)-2-thienyl]benzo[c]1,2,5-thiadiazole (MPDTBOP), the devices comprising the solutions object of the present invention (PEG8, PEG9, PEG10, PPG1 and PPG3) exhibit an efficiency, in terms of the average effective maximum power ($P_{max\ average}$), comparable to that of devices comprising the known solutions (Ref. 1 and Ref. 2);

in the case of Lumogen® F Red 305, the device comprising the solution of the present invention (PEG11) shows an efficiency, in terms of the average effective maximum power ($P_{max\ average}$), good but lower than that of the device comprising the known solution (Ref. 3); the device comprising the solution object of the present invention (PPG2) exhibits an efficiency, in terms of the average effective maximum power ($P_{max\ average}$), comparable to that of the device comprising the known solution (Ref. 3).

EXAMPLE 5

Measures of Photostability

The PPG1 and PPG4 solutions were diluted with the same solvent present in them in order to obtain a concentration of the photoluminescent compound present equal to $1 \times 10^{-5}$ M, obtaining the following PPG1a and PPG4a solutions.

The above mentioned solutions were subjected to UV-visible spectroscopy by operating as follows. Each solution was poured into a vial of about 20 ml with a screw cap up to ⅔ of the volume and aged under continuous lighting in an Atlas XenoTest Beta+ device according to DIN EN ISO 4892-2:2013 procedure. After 24 hours of aging, the vials were removed and the solutions were subjected to UV-visible spectroscopy in order to obtain the amount of photoluminescent compound still present. The UV-Vis spectra were recorded with a double beam spectrophotometer and a double Perkin Elmer Lambda 950 monochromator.

In the solutions subjected to accelerated aging the UV-Vis absorption spectrophotometry allowed the monitoring of the absorbance decrease in the visible region by measuring the relative absorbance in percent (A %) defined as (At)/(A0), that is, as the ratio between the absorbance at time t (At) and the absorbance at time 0 (A0).

Table 2 shows the relative absorbance values in percent (A %) [(At)/(A0)] after 24 hours of aging.

TABLE 2

| SAMPLE | PHOTOLUMINESCENT COMPOUND | SOLVENT | (A %) [(At)/(A0)] |
|---|---|---|---|
| PPG1a | MPDTBOP | PPG425 | 82 |
| PPG4a | MPDTBOP | PPG2700 | 100 |

From the data shown in Table 2 it is deduced that the solutions object of the present invention (PPG1a and PPG3a) have good stability.

The invention claimed is:

1. Luminescent solar concentrator (LSC) comprising at least one liquid solution including at least one photoluminescent compound and at least one polyether polyol, wherein the at least one photoluminescent compound is selected from the group consisting of perylene compounds, benzothiadiazole compounds, distributed benzoheterodiazole compounds, distributed diaryloxybenzoheterodiazole compounds, and combinations thereof.

2. Luminescent solar concentrator (LSC) according to claim 1, wherein said photoluminescent compound is present in said solution in a molar concentration ranging from $1 \times 10^{-4}$ M to $3 \times 10^{-3}$ M.

3. Luminescent solar concentrator (LSC) according to claim 1, wherein said polyether polyol is selected from polyethylene glycols having a number average molecular weight (Mn) ranging from 150 daltons to 600 daltons, or mixtures thereof;
polypropylene glycols having a number average molecular weight (Mn) ranging from 250 daltons to 4000 daltons, or mixtures thereof; or mixtures thereof.

4. Photovoltaic device (or solar device) comprising at least one photovoltaic cell (or solar cell) or at least one photoelectrolytic cell placed on the edges of at least one luminescent solar concentrator (LSC) according to claim 1.

5. Photovoltaic window comprising at least one photovoltaic cell (or solar cell) or at least one photoelectrolytic cell placed on the edges of at least one luminescent solar concentrator (LSC) according to claim 1.

6. Luminescent solar concentrator (LSC) according to claim 1, wherein said photoluminescent compound is present in said solution in a molar concentration ranging from $0.5 \times 10^{-3}$ M to $2 \times 10^{-3}$ M.

7. Luminescent solar concentrator (LSC) comprising:
a cell for liquids of a transparent material, said cell having four sides and being provided with at least one hole on at least one of the four sides;
at least one liquid solution including at least one photoluminescent compound selected from the group consisting of perylene compounds, benzothiadiazole compounds, distributed benzoheterodiazole compounds, distributed diaryloxybenzoheterodiazole compounds, and combinations thereof and at least one polyether polyol contained within said cell for liquids, wherein said photoluminescent compound is present in said solution in a molar concentration ranging from $1 \times 10^{-4}$ M to $3 \times 10^{-3}$ M.

8. Luminescent solar concentrator (LSC) according to claim 7, wherein said transparent material is selected from transparent glass such as silica, quartz, alumina, titania, or mixtures thereof.

9. Luminescent solar concentrator (LSC) according to claim 7, wherein said polyether polyol is selected from polyethylene glycols having a number average molecular weight (Mn) ranging from 150 daltons to 600 daltons, or mixtures thereof;
polypropylene glycols having a number average molecular weight (Mn) ranging from 250 daltons to 4000 daltons, or mixtures thereof; or mixtures thereof.

10. Photovoltaic device (or solar device) comprising at least one photovoltaic cell (or solar cell) or at least one photoelectrolytic cell placed on the edges of at least one luminescent solar concentrator (LSC) according to claim 9.

11. Luminescent solar concentrator (LSC) according to claim 7, wherein said transparent material is selected from transparent glass such as silica, quartz, alumina, titania, or mixtures thereof; wherein said photoluminescent compound is present in said solution in a molar concentration ranging from $0.5 \times 10^{-3}$ M to $2 \times 10^{-3}$ M wherein said polyether polyol is selected from polyethylene glycols having a number average molecular weight (Mn) ranging from 150 daltons to 600 daltons, or mixtures thereof; polypropylene glycols having a number average molecular weight (Mn) ranging from 250 daltons to 4000 daltons, or mixtures thereof; or mixtures thereof.

* * * * *

UNITED STATES PATENT AND TRADEMARK OFFICE
CERTIFICATE OF CORRECTION

| | | |
|---|---|---|
| PATENT NO. | : 11,380,810 B2 | Page 1 of 1 |
| APPLICATION NO. | : 16/334983 | |
| DATED | : July 5, 2022 | |
| INVENTOR(S) | : Giuiliana Schimperna and Liliana Gila | |

It is certified that error appears in the above-identified patent and that said Letters Patent is hereby corrected as shown below:

On the Title Page

Column 1, Item (73) Assignee; Change "ENUI S.P.A." to -- ENI S.P.A. --

Signed and Sealed this
Twenty-seventh Day of December, 2022

Katherine Kelly Vidal
*Director of the United States Patent and Trademark Office*